(12) United States Patent
Van Dyken

(10) Patent No.: US 8,201,126 B1
(45) Date of Patent: Jun. 12, 2012

(54) METHOD AND APPARATUS FOR PERFORMING HARDWARE ASSISTED PLACEMENT

(75) Inventor: John Curtis Van Dyken, Caledon (CA)

(73) Assignee: Altera Corporation, San Jose, CA (US)

( * ) Notice: Subject to any disclaimer, the term of this patent is extended or adjusted under 35 U.S.C. 154(b) by 238 days.

(21) Appl. No.: 12/590,643

(22) Filed: Nov. 12, 2009

(51) Int. Cl.
  G06F 17/50 (2006.01)
  G06F 9/44 (2006.01)
  G06F 13/10 (2006.01)
(52) U.S. Cl. ........ 716/116; 716/117; 716/121; 716/128; 703/16; 703/20
(58) Field of Classification Search .......... 716/116, 716/117, 121, 128; 703/16, 20
See application file for complete search history.

(56) References Cited

U.S. PATENT DOCUMENTS

| | | | | |
|---|---|---|---|---|
| 6,002,861 | A * | 12/1999 | Butts et al. ................ | 703/16 |
| 6,185,725 | B1 * | 2/2001 | Pedersen .................... | 716/105 |
| 6,289,488 | B1 * | 9/2001 | Dave et al. ................. | 716/105 |
| 6,550,042 | B1 * | 4/2003 | Dave ........................... | 716/105 |
| 6,957,412 | B1 | 10/2005 | Betz | |
| 7,000,213 | B2 * | 2/2006 | Banerjee et al. ........... | 716/103 |
| 7,215,137 | B1 * | 5/2007 | Nisbet ......................... | 326/38 |
| 7,895,558 | B2 * | 2/2011 | Roesner et al. ............. | 716/116 |
| 2003/0105617 | A1 * | 6/2003 | Cadambi et al. ........... | 703/14 |
| 2003/0229877 | A1 | 12/2003 | Bersch et al. | |
| 2004/0250231 | A1 | 12/2004 | Killian et al. | |
| 2005/0125754 | A1 * | 6/2005 | Schubert et al. ........... | 716/5 |
| 2005/0229140 | A1 * | 10/2005 | Tsai et al. .................... | 716/17 |
| 2006/0190906 | A1 * | 8/2006 | Samanta et al. ............ | 716/18 |
| 2007/0198959 | A1 * | 8/2007 | Schubert et al. ........... | 716/4 |
| 2007/0214445 | A1 * | 9/2007 | DeHon et al. ............... | 716/10 |
| 2007/0219771 | A1 * | 9/2007 | Verheyen et al. ........... | 703/15 |
| 2008/0059921 | A1 * | 3/2008 | Esliger et al. ............... | 716/4 |
| 2008/0098340 | A1 * | 4/2008 | Oh ................................ | 716/8 |
| 2008/0244471 | A1 * | 10/2008 | Killian et al. ............... | 716/1 |
| 2008/0319730 | A1 * | 12/2008 | Clark et al. .................. | 703/19 |
| 2009/0144690 | A1 * | 6/2009 | Spackman et al. ......... | 716/18 |
| 2010/0281451 | A1 * | 11/2010 | Eng .............................. | 716/106 |

OTHER PUBLICATIONS

Wrighton, Michael G., DeHon, Andre M., "Hardware-Assisted Simulation Annealing with Application for Fast FPGA Placement", Feb. 23, 2003, International Symposium on Field-Programmable Gate Arrays (FPGA '03), Monterey, California, ACM.

* cited by examiner

Primary Examiner — Phallaka Kik
(74) Attorney, Agent, or Firm — L. Cho

(57) ABSTRACT

A method for designing a system on a target device is disclosed. A first plurality of components in the system are assigned to be placed by an computer aided design (CAD) tool based on a criterion. A second plurality of components in the system are assigned to be placed by a hardware placement unit based on the criterion. Placement results from the CAD tool and the hardware placement unit are used to generate a placement solution for the system on the target device. Other embodiments are described and claimed.

26 Claims, 15 Drawing Sheets

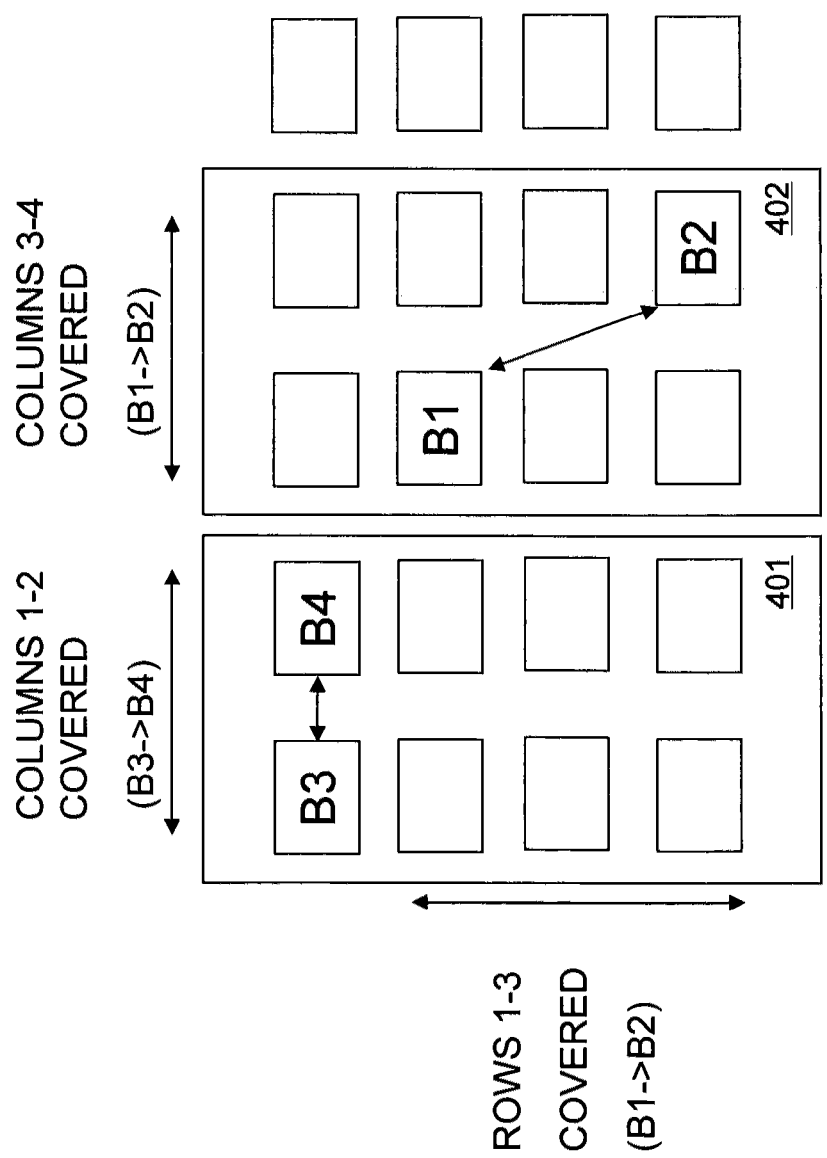

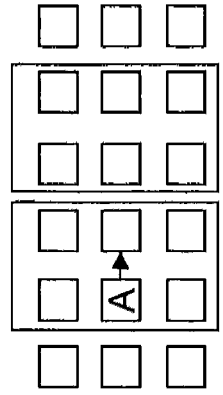
FIG. 5a Horizontal Partition 1
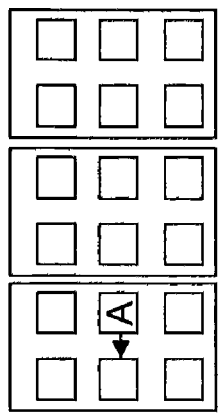
FIG. 5b Horizontal Partition 2
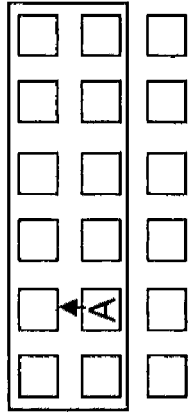
FIG. 5c Vertical Partition 1
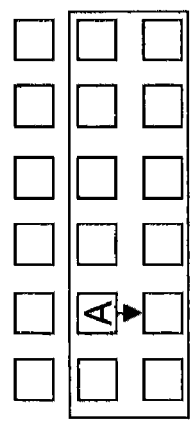
FIG. 5d Vertical Partition 2

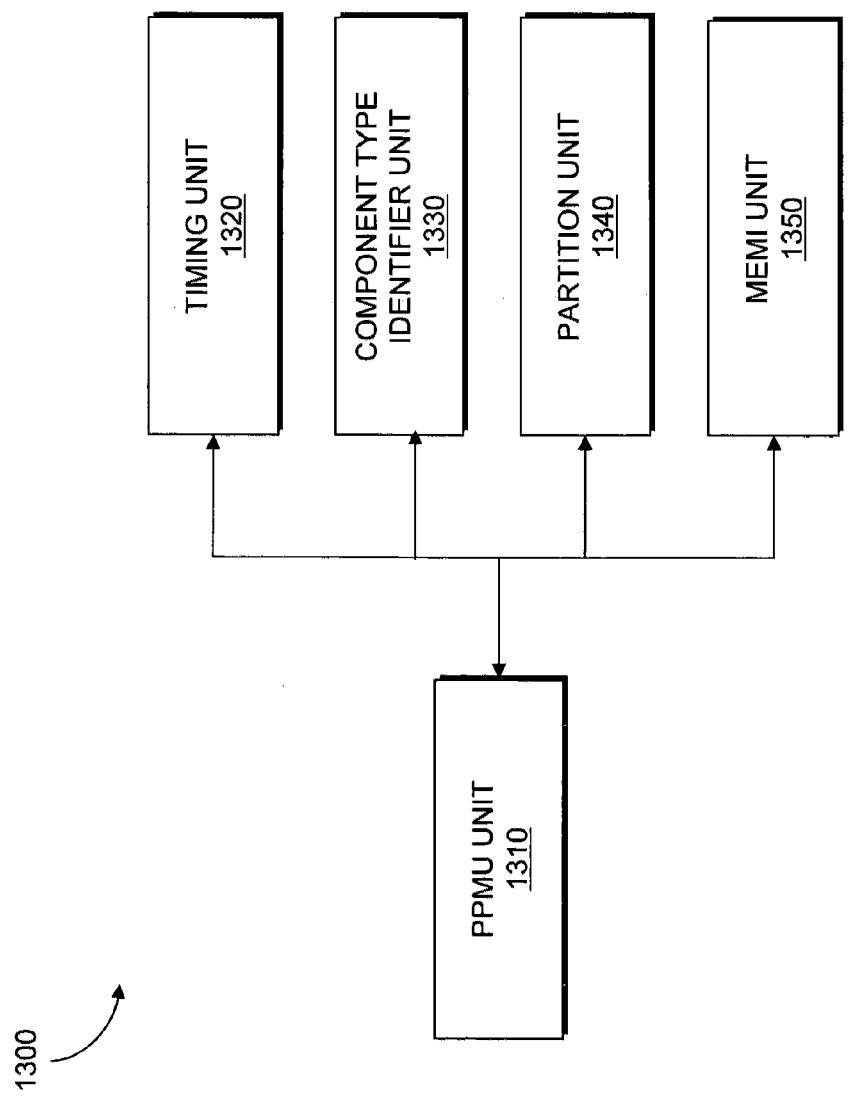

METHOD AND APPARATUS FOR PERFORMING HARDWARE ASSISTED PLACEMENT

FIELD

Embodiments of the present invention relate to tools for designing systems on target devices. More specifically, embodiments of the present invention relate to a method and apparatus for performing hardware assisted placement.

BACKGROUND

Electronic designs for large systems may include millions of gates and megabits of embedded memory. Of the tasks required in managing and optimizing electronic designs on a target device, synthesis, placement, and routing utilizing available resources can be among the most challenging and time consuming. The complexity of large systems often requires the use of computer aided design (CAD) or electronic design automation (EDA) tools to manage and optimize designs. CAD tools perform the time-consuming tasks of synthesis, placement, and routing on a target device.

Placement currently accounts for approximately 50% of design time in large systems. The density of today's target devices such as field programmable gate arrays (FPGAs) is outpacing increases in processor speed and the rate in which CAD procedures operate, leading to increases in placement compile times. One approach used to address this problem is to use hardware assisted placement in lieu of placement algorithms provided by CAD tools.

Hardware assisted placement techniques of the past suffered from a number of limitations associated with deriving the cost metrics used in placement. For example, hardware assisted placement techniques of the past suffered from using information that was stale when computing the bounding box cost of a net used to bound the terminals for the net. Hardware assisted placement techniques of the past also failed to provide consideration for timing critical paths which resulted in the maximum frequency at which a design can run to be adversely impacted.

Thus, what is needed is a method and apparatus for performing hardware assisted placement that efficiently and accurately derives cost metrics used in placement.

BRIEF DESCRIPTION OF THE DRAWINGS

The features and advantages of embodiments of the present invention are illustrated by way of example and are not intended to limit the scope of the embodiments of the present invention to the particular embodiments shown.

FIG. 4 illustrates an example of mutually exclusive moves.

FIGS. 5$a$-$d$ illustrate examples of partitioning groups of virtual logic elements into sections to allow a block to be moved to different VLEs.

FIG. 13 is a block diagram of a placement preparation unit according to an embodiment of the present invention.

SUMMARY

According to an exemplary embodiment of the present invention, a method and apparatus for designing a system on a target device is disclosed. A first plurality of components in the system is assigned to be placed by a computer aided design (CAD) tool based on a criterion. A second plurality of components in the system is assigned to be placed by a hardware placement unit based on the criterion. Placement results from the CAD tool and the hardware placement unit are utilized to generate a placement solution for the system on the target device. The hybrid hardware software placement technique disclosed increases parallelism while addressing timing critical paths which allows the resulting system design to operate at an acceptable maximum frequency.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
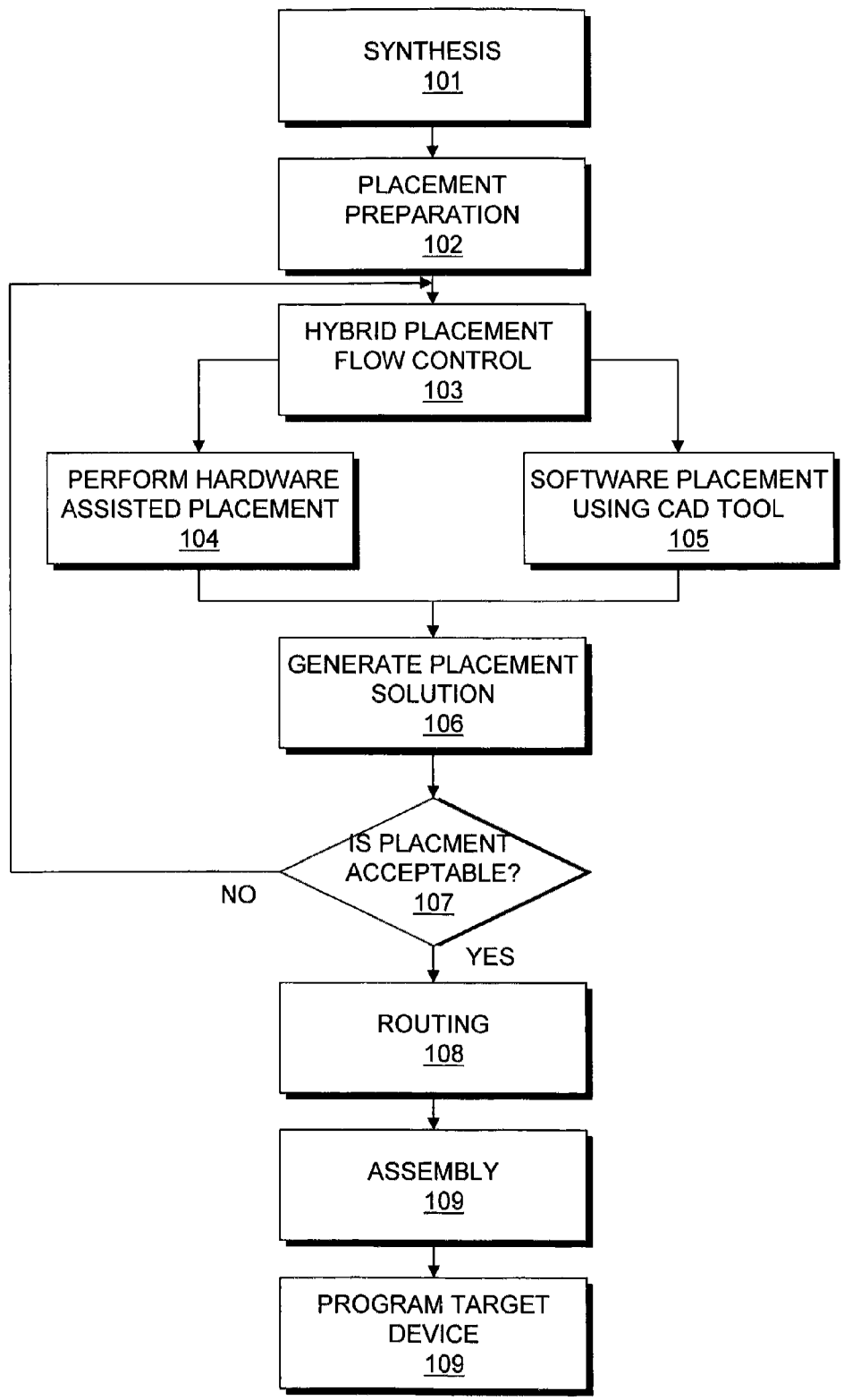
FIG. 1 is a flow chart illustrating a method for designing a system according to an exemplary embodiment of the present invention.

FIG. 1 is a flow chart illustrating a method for designing a system on a target device according to an exemplary embodiment of the present invention. The target device may be an FPGA, ASIC, a structured ASIC, or other device. According to one embodiment, the procedure illustrated in FIG. 1 may be performed by a computer aided design (CAD)/electronic design automation (EDA) tool implemented on a computer system. At 101, the system is synthesized. Synthesis includes generating a logic design of the system to be implemented. According to an embodiment of the present invention, synthesis generates an optimized logical representation of the system from the HDL design definition. The optimized logical representation of the system may include a representation that has a minimized number of functional blocks and registers ("components"), such as logic gates and logic elements, required for the system. Synthesis also includes mapping the optimized logic design (technology mapping). Mapping includes determining how to implement logic gates and logic elements in the optimized logic representation with resources available on the target device. According to an embodiment of the present invention, a netlist is generated from mapping. This netlist may be an optimized technology-mapped netlist generated from the HDL.

At 102, placement preparation is performed. According to an embodiment of the present invention, placement preparation involves identifying components in the optimized technology-mapped netlist to place and determining which components to assign to a CAD placement procedure for placement and which components to assign to a hardware placement unit for placement. Among components to assign to the hardware placement unit, a schedule may be maintained to determine an order in which components are to be placed and whether components are to be placed in parallel.

At 103, it is determined whether placement to be performed on a particular component is to be performed by a hardware placement unit or by a placement procedure implemented by a CAD tool. If placement is to be performed by a hardware placement unit, control proceeds to 104. If placement is to be performed by a placement procedure implemented by a CAD tool, control proceeds to 105.

At 104, components in the mapped logical system design are placed by the hardware placement unit. Placement works on the optimized technology-mapped netlist to produce a placement for each of the functional blocks. According to an embodiment of the present invention, placement includes fitting the system on the target device by determining which resources on the logic design are to be used for specific logic elements, and other function blocks determined to implement the system as determined during synthesis. According to an embodiment of the present invention, placement may involve starting with an initial placement of the components and swapping locations of the components with other components on the target device. A cost may be computed for the swap. Whether the swap is desirable may be determined from the cost computed. Control proceeds to 106.

At 105, components in the mapped logical system design are placed by the CAD tool. The CAD tool may utilize one or more placement procedures that are implemented in software and executed by a processor in a computer system. Placement works on the optimized technology-mapped netlist to produce a placement for each of the functional blocks. According to an embodiment of the present invention, placement includes fitting the system on the target device by determining which resources on the logic design are to be used for specific logic elements, and other function blocks determined to implement the system as determined during synthesis. Placement may include clustering which involves grouping logic elements together to form the logic clusters present on the target device. According to an embodiment of the present invention, clustering is performed at an early stage of placement and occurs directly after synthesis during the placement preparation stage.

At 106, a placement solution is generated from a placement solution generated from the hardware placement unit from procedure 104 and from a placement solution generated from the placement procedure implemented from the CAD tool from procedure 105.

At 107, it is determined whether the placement is acceptable. According to an embodiment of the present invention, placement may be assessed using a number of parameters including timing, distance, and/or other criteria. If timing is acceptable, control proceeds to 108. If timing is not acceptable, control returns to 103. At 103, another iteration of hardware assisted placement and/or software placement using a CAD tool may be performed to generate a different placement solution.

At 108, the placed design is routed. During routing, routing resources on the target device are allocated to provide interconnections between logic gates, logic elements, and other components on the target device. Routability optimization may also be performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 109, an assembly procedure is performed. The assembly procedure involves creating a data file that includes information determined by the compilation procedure described by 101-108. The data file may be a bit stream that may be used to program a target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

At 109, the target device is programmed with the data file. By programming the target with the data file, components on the target device are physically transformed to implement the system. According to an embodiment of the present invention where the target device is an ASIC or other target device other than an FPGA, procedures 108 and 109 may not be performed.

Figure 2:
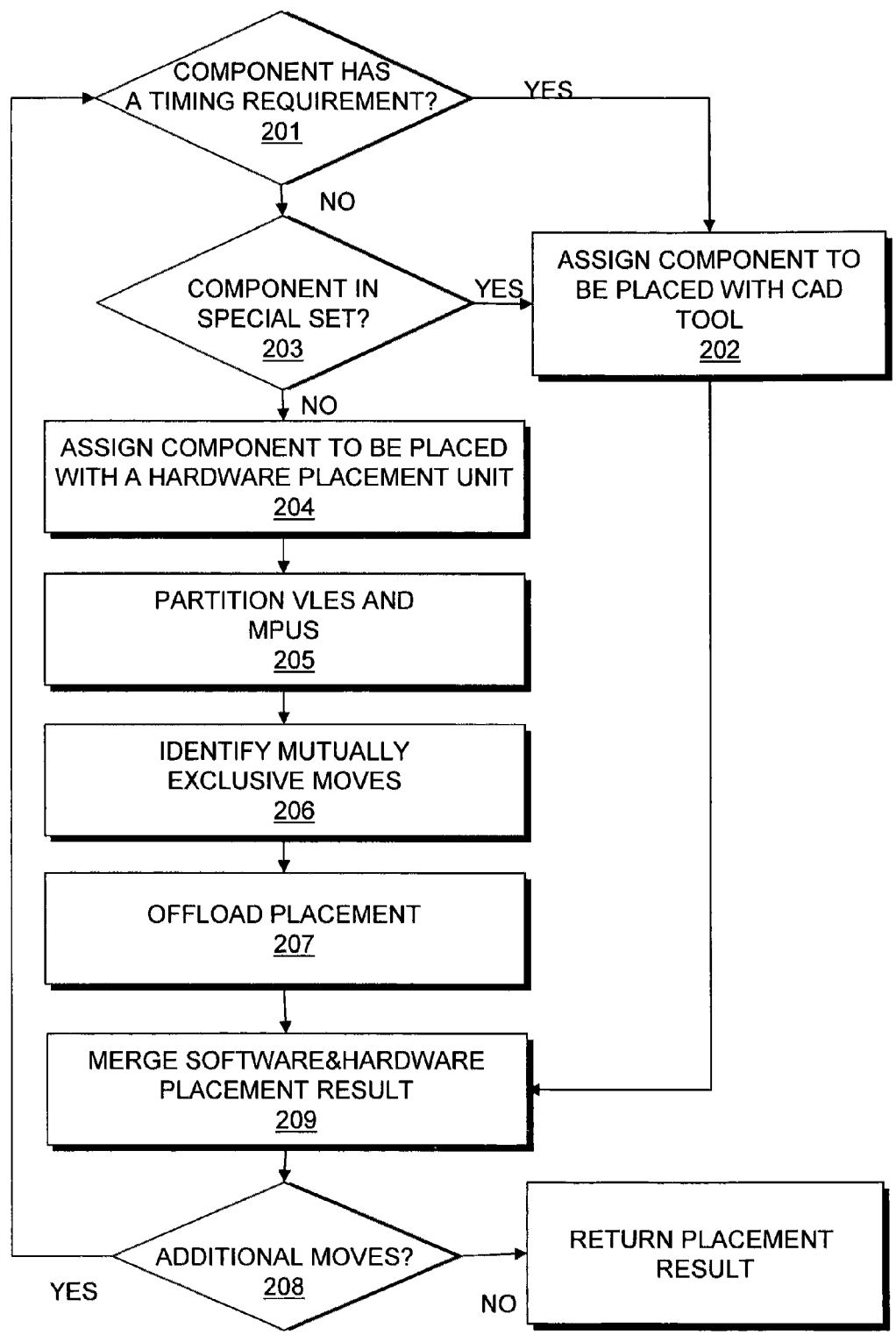
FIG. 2 is a flow chart illustrating a method for performing placement preparation according to an exemplary embodiment of the present invention.

FIG. 2 is a flow chart illustrating a method for performing placement preparation according to an exemplary embodiment of the present invention. The procedure illustrated in FIG. 2 may be used at 102 to implement procedures illustrated at 102-106 in FIG. 1. At 201, it is determined whether a component has a timing requirement that is above or below a threshold value. This criterion may be used to determine whether the component is a critical component with respect to timing, associated with a critical signal, or is on a critical path. If it is determined that the component has a timing requirement that is above or below a threshold value, control proceeds to 202. If it is determined that the component does not have a timing requirement that is above or below a threshold value, control proceeds to 203.

At 202, the component is identified as a component to be placed using a CAD tool implemented in software by a computer system.

At 203, it is determined whether the component is of a type belonging to a set of components. According to an embodiment of the present invention, the set of components may include one or more of an input output (IO), memory, and digital signal processor (DSP), or other type of component. If the component satisfies this criterion and belongs to the set of components, control proceeds to 202. If the component is not of a type that belongs to the set of components, control proceeds to 204.

At 204, the component is identified as a component to be placed using a physical placement unit.

At 205, resources on the target devices that are available to be assigned to components are mapped to virtual logic elements (VLEs) on the hardware placement unit. It should be appreciated that resources used to support placement of components identified at 202 may be determined to be unavailable resources. Each VLE may represent a plurality of resources on the target device. Each VLE may include a position coordinate on the target device as well as information on all nets associated with the plurality of components using the resources.

Figure 3:
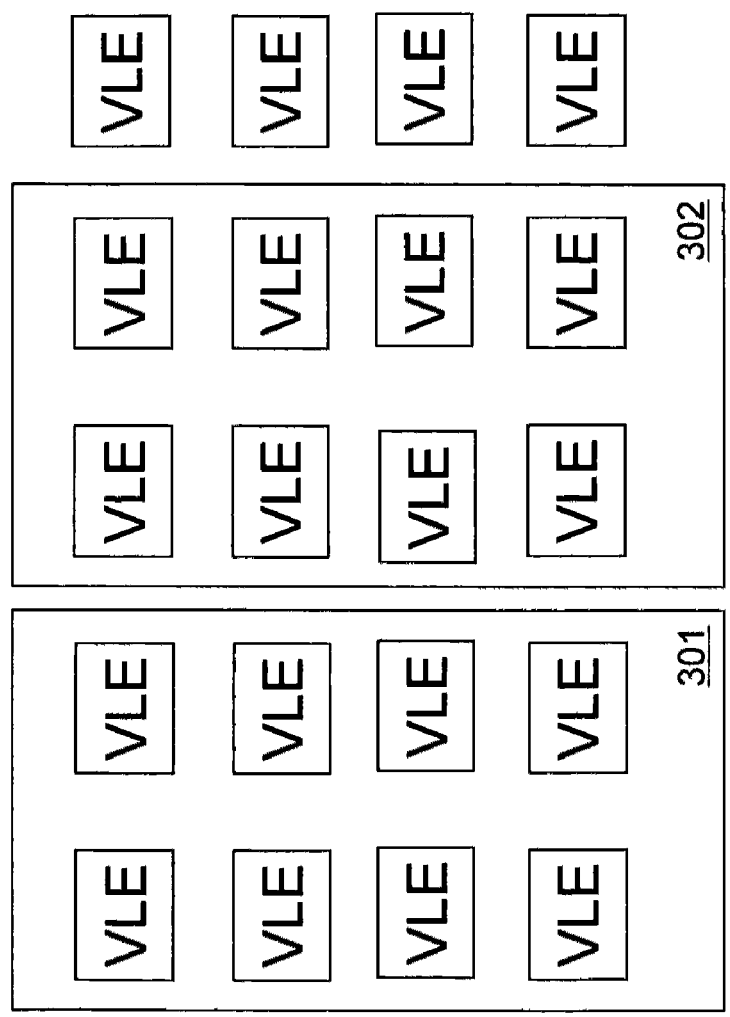
FIG. 3 illustrates an example of partitioning groups of virtual logic elements into sections.

FIG. 3 illustrates an embodiment of the present invention where the VLEs are arranged in rows and columns on the hardware placement unit. The VLEs may be partitioned into sections 301-302 where a move processing unit (MPU) (not shown) is assigned to each of the sections. During an iteration of placement, the MPUs compute the cost of moving components between VLEs in each section.

Referring back to FIG. 2, at 206, mutually exclusive sets of moves are identified. Two individual moves are mutually exclusive if the rows/columns covered by the moves do not intersect. According to an embodiment of the present invention, mutually exclusive sets of moves are identified in order to allow MPUs to compute the cost of moving components between VLEs in parallel. The largest number of mutually exclusive moves is achieved by considering adjacent horizontal or vertical moves. Considering an n×n matrix of VLEs, there is a maximum of n/2 known pairs of blocks that can be swapped simultaneously.

FIG. 4 illustrates an example of mutually exclusive moves. In this example, a plurality of blocks B1-B4 include components in a system design to be placed. Block B1 initially resides at a VLE on a third column and a third row. Block B2 initially resides at a VLE on a first row and fourth column. Block 3 initially resides at VLE on a fourth row and first column. Block B4 initially resides at a VLE on a fourth row and a second column. The move of block B1 to the position of B2 is mutually exclusive with respect to the move of block B3 to the position of B4. The move of B1 to B2 covers rows 1-3 and columns 3-4. The move of B3 to B4 covers row 1 and columns 1-2.

Referring back to FIG. 2, at 207, components assigned to be placed by the physical placement unit are off loaded to the physical placement unit. According to an embodiment of the present invention, the physical placement unit computes the cost of a move and accepts the move if the cost is within a predetermined range.

At 208, it is determined whether additional moves are to be considered. According to an embodiment of the present invention, additional moves may be considered if a number of iterations have not exceed a threshold number, if the cost associated with placement of components exceed a threshold cost value, or other criteria. If additional moves are not to be considered control proceeds to 209 where placement results are returned. If additional moves are to be considered, control returns to 205. Upon returning to 205, the VLEs on the hardware placement unit may be partitioned in a different configuration where MPUs may compute the cost of moving components between different VLEs for additional placement options. According to an embodiment of the present invention, the placement schedule progresses components will shift between hardware placement and software placement. For example, at the beginning of the placement anneal a block may be non-critical to timing and thus be placed by the hardware placement engine. After a large number of placement iterations it is possible that this component will eventually become timing critical. In this case, the block will be re-assigned to the software placer in order to get optimal placement in terms of timing. The hardware placement unit and software placement procedures implemented with a CAD tool work in parallel. The software placement procedures takes the results returned from the hardware placement unit and merge them with its current view of placement.

FIGS. 5a-d illustrate examples of partitioning groups of VLEs into different configurations to allow a block, A, to be moved to different VLEs and be implemented by different resources on the target device. FIG. 5A illustrates a first horizontal partition configuration where VLEs are shown to be partitioned into three sections where blocks at a VLE are allowed to be moved to another VLE positioned horizontally adjacent to it. As shown, block A initially residing at a VLE on a second row and second column may be moved to a VLE on the second row and first column. During a block swapping iteration, every block swaps location with its neighbor. For example, in FIG. 5A, all blocks in column one attempts a swap with the neighbor in column 2. According to one embodiment, where n is the number of VLEs in a row or column, there will be n/2 MPUs computing moves in parallel where each MPU operates independently of each other.

FIG. 5B illustrates a second horizontal partition configuration where VLEs are shown to be partitioned into two sections where blocks at a VLE are also allowed to be moved to another VLE positioned horizontally adjacent to it. As shown, block A initially residing at a VLE on a second row and second column may be moved to a VLE on the second row and third column.

FIG. 5C illustrates a first vertical partition configuration where VLEs are shown to be partitioned into a section that includes the first and second rows where blocks at a VLE are also allowed to be moved to another VLE positioned vertically adjacent to it. As shown, block A initially residing at a VLE on a second row and second column may be moved to a VLE on the first row and second column.

FIG. 5D illustrates a second vertical partition configuration where VLEs are shown to be partitioned into a section that includes the second and third rows where blocks at a VLE are also allowed to be moved to another VLE positioned vertically adjacent to it. As shown, block A initially residing at a VLE on a second row and second column may be moved to a VLE on the third row and second column. By limiting the swap distance to one, a large degree of parallelism may be achieved. In this embodiment, four iterations are used to cover the four move directions for each block.

Figure 6:
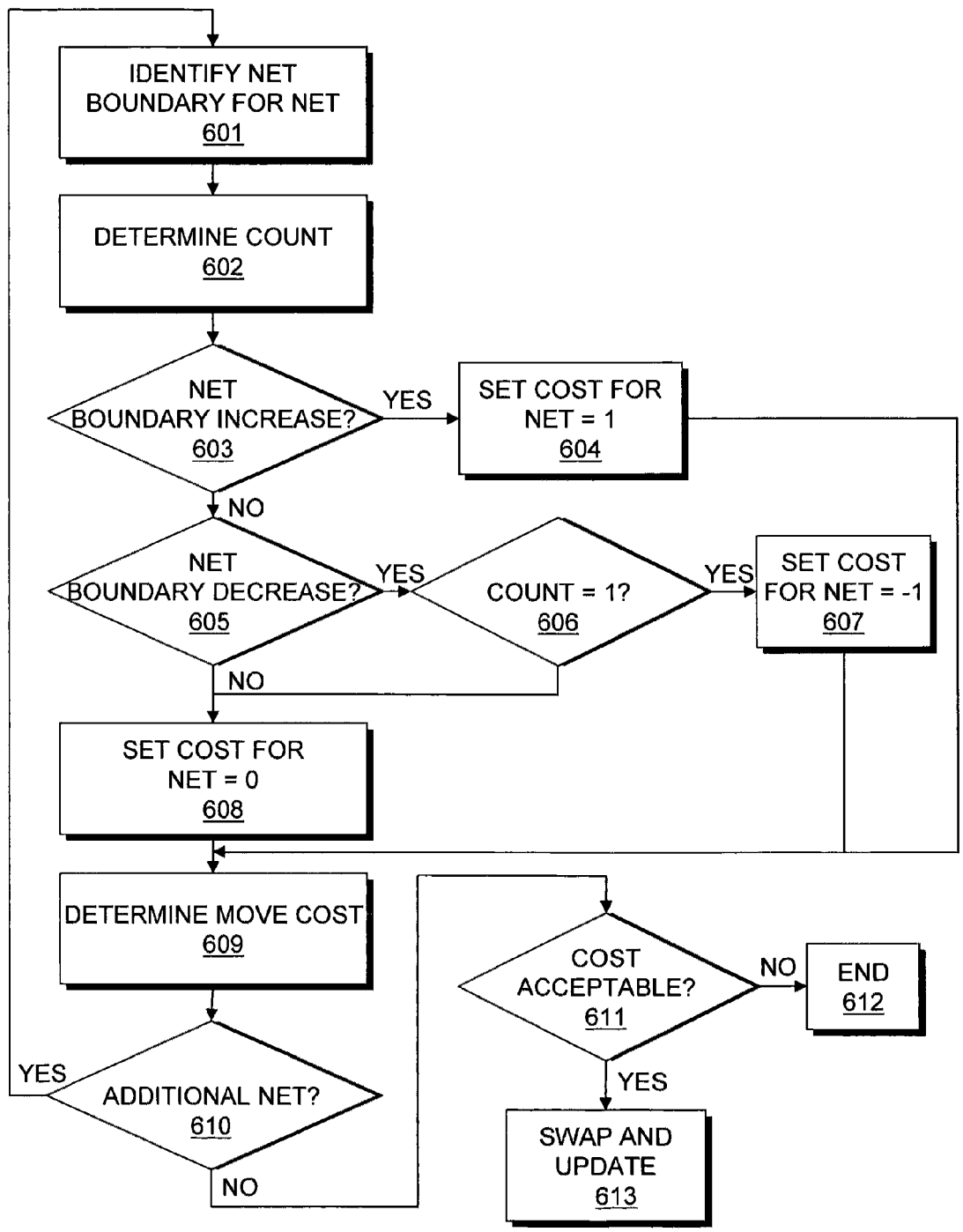
FIG. 6 is a flow chart illustrating a method for performing hardware assisted placement according to an embodiment of the present invention.

FIG. 6 is a flow chart illustrating a method for performing hardware assisted placement according to an embodiment of the present invention. The procedure illustrated in FIG. 6 may be used at 104 in FIG. 1. At 601, net boundaries are identified for a net associated with a block to be moved. The net boundaries define a bounding box that encloses the net on the target device. According to an embodiment of the present invention, the net boundaries may be identified from net boundary elements (NBEs) for the net. A net boundary element represents the edges of a net on a target design. The NBEs can be viewed as tracking the left, right, top, and bottom boundaries of a target device where the chip is viewed as a two dimensional plane with x and y coordinates. According to an embodiment of the present invention, each NBE tracks the x and y location of the net boundary as well as a count of a number of VLEs associated with the net that exist on a net boundary. At 601, the NBEs are identified for a net associated with a block at its initial location and at its moved location.

At 602, a count which identifies a number of VLEs associated with the net that exist on a net boundary that is changed in response to moving the block is determined. VLEs may be associated with a net if they are used to implement components coupled to the net. According to an embodiment of the present invention, the count may be determined from NBEs for the net.

At 603, it is determined whether the net boundary increases with the move. A net boundary increases if the area of a net's bounding box increases. If the net boundary increases, control proceeds to 604. If the net boundary does not increase, control proceeds to 605.

At 604, the cost for the net is set to 1.

At 605, it is determined whether the net boundary decreases with the move. A net boundary decreases if the area of a net's bounding box decreases. If the net boundary decreases, control proceeds to 606. If the net boundary does not decrease, control proceeds to 608.

At 606, it is determined whether the count identifying a number of VBEs used to implement components coupled to a net that reside along on a net boundary that is changed in response to the move is 1. If the count for the net is 1, control proceeds to 607. If the count for the net is not 1, control proceeds to 608.

At 607, the cost for the net is set to −1.

At 608, the cost for the net is set to 0.

At 609, the cost for the move is determined. According to an embodiment of the present invention, the cost for a move may be generated by taking a linear sum of the cost of all nets associated with moving the block. According to an alternate embodiment of the present invention, the cost for moving a block is determined using a non-linear equation. The non-linear equation may be applied to the cost of the net determined, for example, to predict wire length.

At 610, it is determined whether additional nets are associated with the block. If additional nets are associated with the block, control proceeds to 601 to evaluate the cost associated with moving the block with respect to a net that has not been evaluated. If additional nets are not associated with the block, control proceeds to 611.

At 611, it is determined whether the cost associated with the move is acceptable. If the cost of the move is not acceptable, control proceeds to 612. If the cost of the move is acceptable, control proceeds to 613.

At 612, the move is rejected and other moves may be considered for the block.

At 613, the block is moved to a new location on the target device. The VLEs representing resources on the target device that implemented the block at the old location and the new location and NBE for nets associated with the block are updated.

According to an embodiment of the present invention, when determining whether a cost for moving a block is acceptable, the cost associated with moving the block from a first location on the target device represented by a first VLE to a second location represented by a second VLE may be considered along with any cost associated with moving another block from the second location represented by the second VLE to the first location represented by the first VLE.

FIGS. 1, 2, and 6 are flow charts that illustrate embodiments of the present invention. Some of the techniques illustrated may be performed sequentially, in parallel or in an order other than that which is described and that the procedures described may be repeated. It should be appreciated that not all of the techniques described are required to be performed, that additional techniques may be added, and that some of the illustrated techniques may be substituted with other techniques.

Figure 7A:
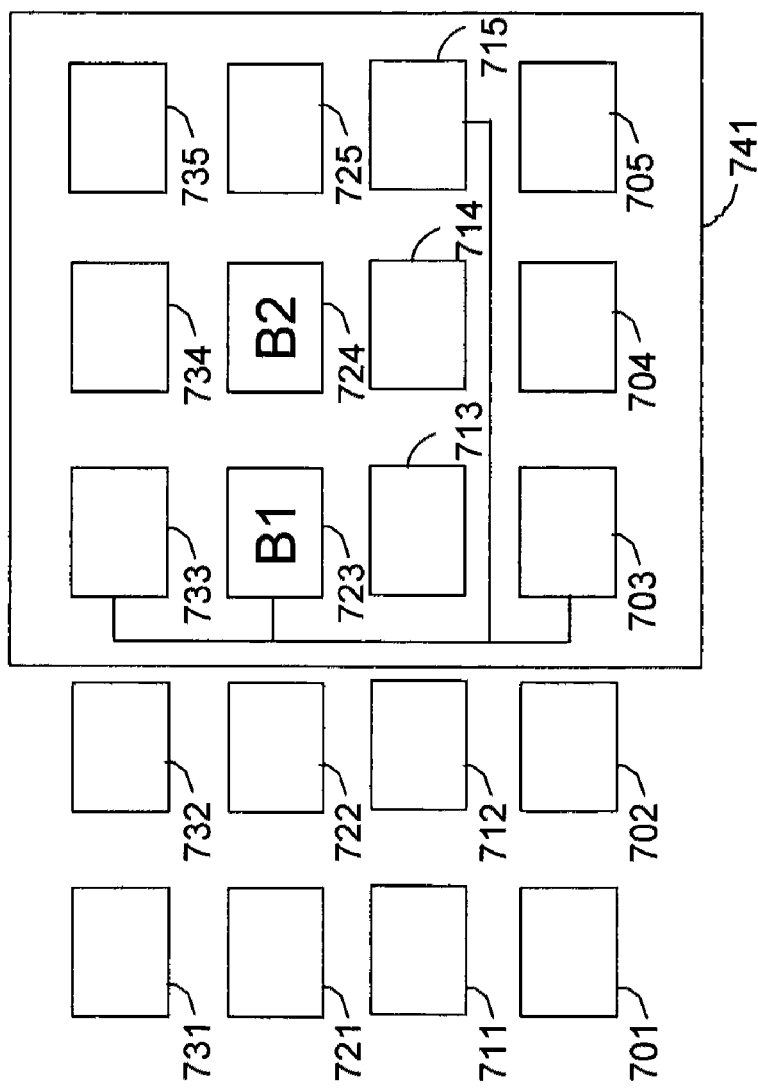
FIGS. 7$a$-$c$ illustrate an examples of computing bounding box costs according to an embodiment of the present invention.
Figure 7B:
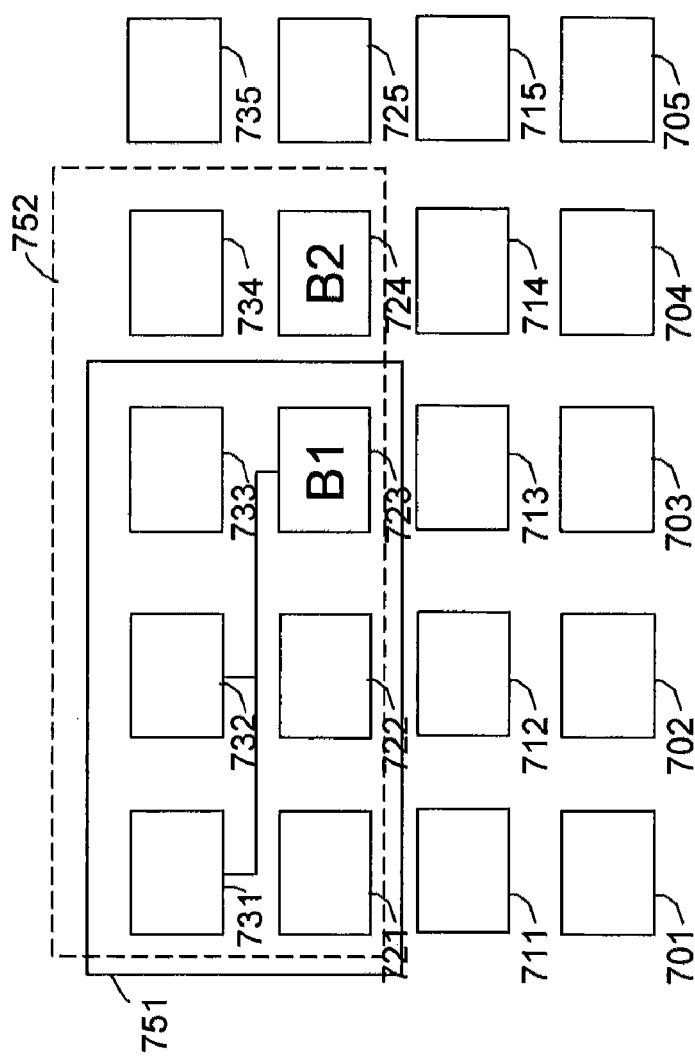
Figure 7C:
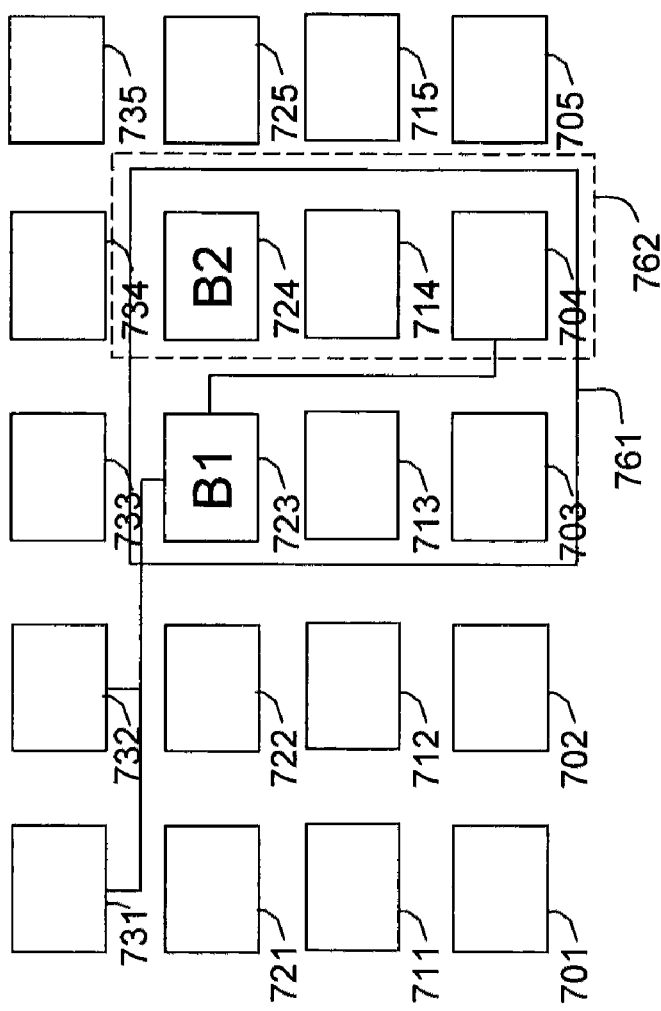

FIGS. 7a-c illustrate examples of computing bounding box costs according to an embodiment of the present invention. FIGS. 7a-7c include a mapping of resources on a target device. The resources include a plurality of VLEs 701-705, 711-715, 721-725, and 731-735 arranged in rows and columns. FIG. 7a illustrates a block B1 which represents a plurality of components in a system design. B1 is initially implemented by resources represented by VLE 723. B1 includes a first net that is coupled to resources represented by VLE 733, 703, and 715. The net boundary for the first net is represented by bounding box 741. If block B1 were to move such that it would be implemented by resources represented by VLE 724, the net boundary for the first net would be the same. Therefore, the cost for moving B1 from VLE 723 to VLE 724 would be 0.

FIG. 7b illustrates a second net associated with block B1. The second net is coupled to resources represented by VLE 731 and 732. The net boundary for the second net is represented by bounding box 751. If block B1 were to move such that it would be implemented by resources represented by VLE 724, the net boundary for the second net would be represented by bounding box 752. The bounding box for the second net would increase. Therefore, the cost for moving B1 from VLE 723 to VLE 724 would be 1.

FIG. 7c illustrates a third net associated with block B1. The third net is coupled to resources represented by VLE 704. The net boundary for the third net is represented by bounding box 761. If block B1 were to move such that it would be implemented by resources represented by VLE 724, the net boundary for the third net would be represented by bounding box 762. The bounding box for the third net would decrease. The count identifying a number of VLEs associated with the net on a boundary that moves is 1. Therefore, the cost for moving B1 from VLE 723 to VLE 724 would be −1.

In this example, the sum of the net cost for moving B1 would be 0. It should be appreciated that the cost associated with moving components represented by B2 to a location represented by VLE 723 may be accounted for when determining whether B1 should be moved.

Figure 8:
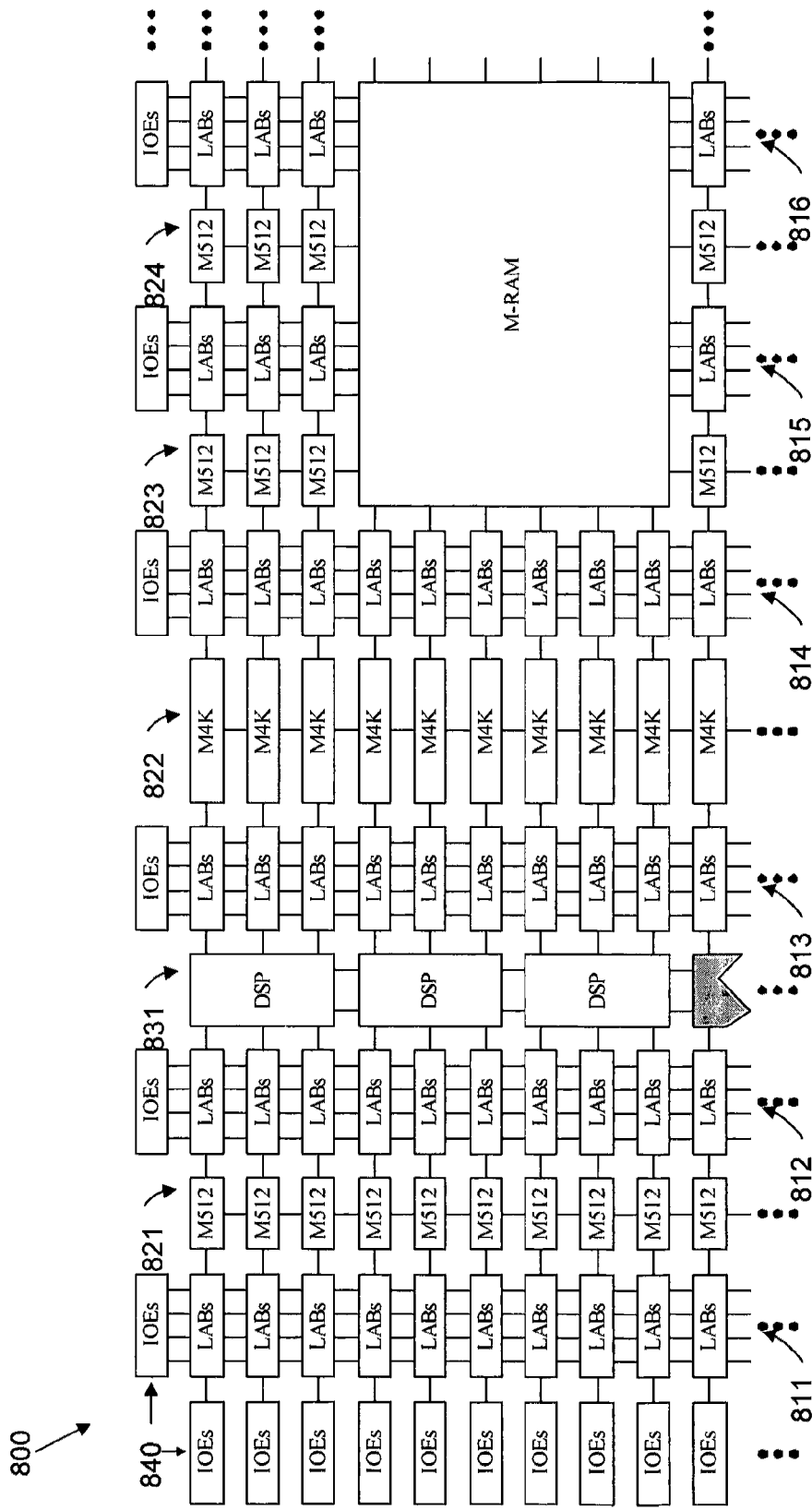
FIG. 8 illustrates a device used to implement a hardware placement unit according to an embodiment of the present invention.

FIG. 8 illustrates a device 800 that may be used to implement a hardware placement unit according to an embodiment of the present invention. The device 800 is a field programmable gate array (FPGA) that includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input lookup table (LUT) with a configurable register. According to an alternate embodiment of the present invention, the logic block may operate similarly to an adaptive logic module (ALM), such as those found in Stratix devices manufactured by Altera Corporation. LABs are grouped into rows and columns across the device 800. Columns of LABs are shown as 811-816. It should be appreciated that the logic block may include additional or alternate components.

The device 800 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 800. Columns of memory blocks are shown as 821-824.

The device 800 includes digital signal processing (DSP) blocks. The DSP blocks may be used to implement multipliers of various configurations with add or subtract features.

The DSP blocks include shift registers, multipliers, adders, and accumulators. The DSP blocks may be grouped into columns across the device 800 and are shown as 831.

The device 800 includes a plurality of input/output elements (IOEs) 840. Each IOE feeds an IO pin (not shown) on the device 800. The IOEs 840 are located at the end of LAB rows and columns around the periphery of the device 800. Each IOE may include a bidirectional IO buffer and a plurality of registers for registering input, output, and output-enable signals.

The device 800 may include routing resources such as LAB local interconnect lines, row interconnect lines ("H-type wires"), and column interconnect lines ("V-type wires") (not shown) to route signals between components on the target device.

FIG. 8 illustrates an exemplary embodiment of a device used to implement a hardware placement unit. It should also be appreciated that, as indicated above, the device may include the same or different semiconductor devices arranged in a different manner. The device 800 may also include FPGA resources other than those described and illustrated with reference to the device illustrated in FIG. 8. Thus, while embodiments of the invention described herein may be utilized on the architecture described in FIG. 8, it should be appreciated that it may also be utilized on different architectures.

Figure 9:
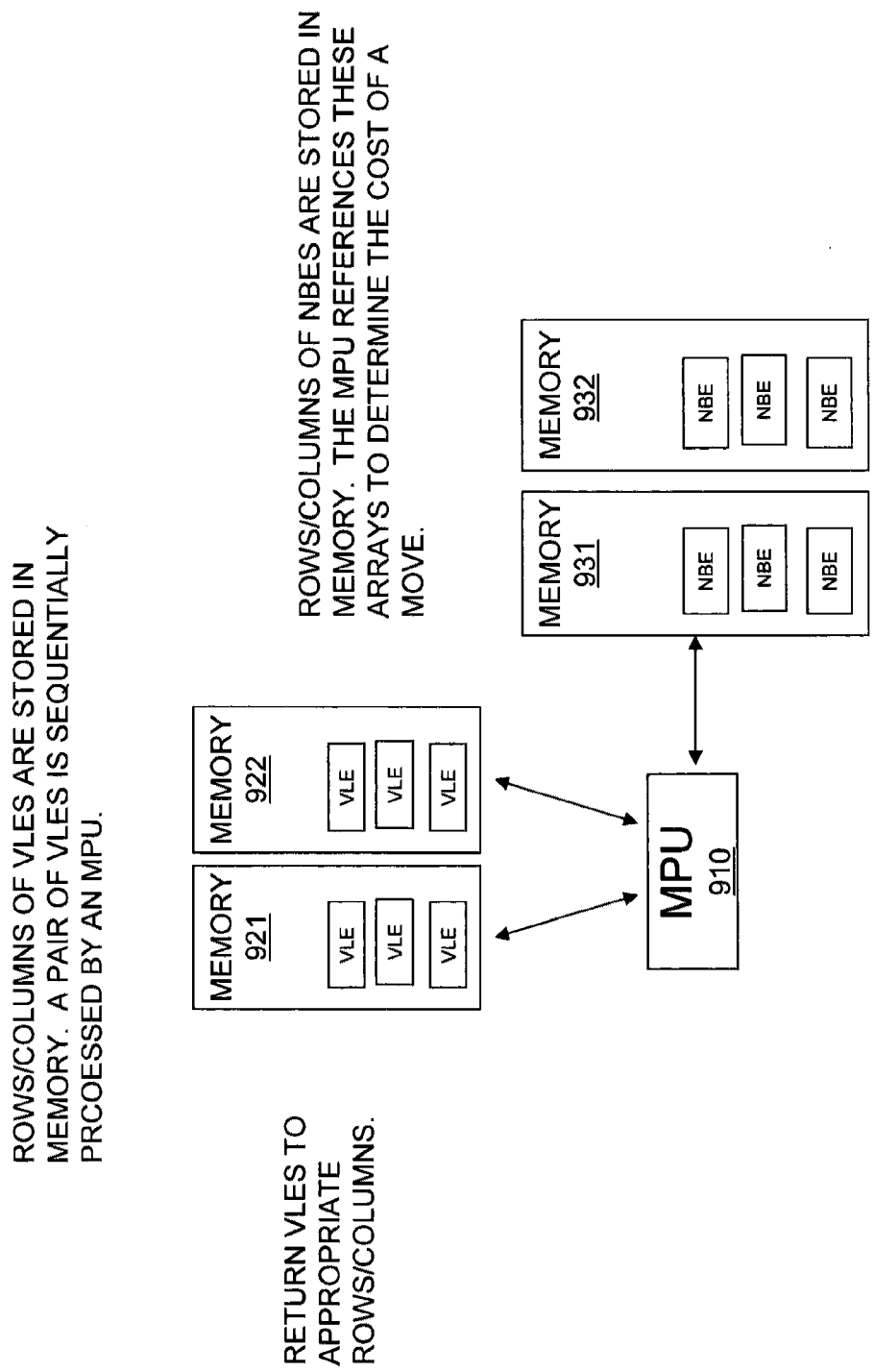
FIG. 9 illustrates the interaction between components of a hardware placement unit according to an exemplary embodiment of the present invention.

FIG. 9 illustrates the interaction between components of a hardware placement unit according to an exemplary embodiment of the present invention. The hardware placement unit includes a plurality of MPUs, one of which is shown in FIG. 9 as MPU 910. The MPU 910 may be implemented by one or more LABs or other resources on an FPGA to compute a cost associated with moving a block.

The hardware placement unit includes a first plurality of memory 921-922 that store either rows or columns of VLEs. The hardware placement unit also includes a second plurality of memory 931-932 that stores either rows or columns of NBEs. The memory 921-922 and 931-932 may be implemented by one or more M4Ks, M512, or other memory blocks on an FPGA.

The MPU 910 computes a cost associated with moving a block between VLEs by accessing information about the block from the VLEs stored in memory 921-922 and the information about net boundaries from the NBEs stored in memory 931-932. The information accessed from memory 921-922 may include the identity of nets associated with the block represented by a VLE. The information accessed from memory 931-932 may include the net boundaries of nets associated with the block and a count of VLEs present along a boundary of a net.

Embodiments of the present invention provide a method for utilizing the parallel computing power of an FPGA to reduce placement time. A hybrid software-hardware placer is disclosed that maintains the flexibility of software placement procedures and also utilizes the parallel processing power of an FPGA. Computing the cost for a moving a block requires a significant amount of time. Two primary cost metrics are used in the cost computations, bounding box costs and timing calculations.

In the past, bounding box costs were calculated by iterating through each net of a block. These calculations were complex due to the high interconnectivity of nets. In addition, the access patterns used in typical moves had the potential to impact any block in a design. This made it challenging to segregate moves into separate independent execution units. When dependencies existed between two moves, parallel execution of the moves could result in inaccurate cost calculations. Furthermore, timing calculations rely heavily on device specific delay calculations. This requires fast memory access to cached delay.

Embodiments of the present invention provide an improved technique for performing bounding box costs by localizing data access. Rather than traversing a highly dispersed fan-out of each net, net edges (boundaries) are traversed. Whether a bounding box increases or decreases may be deduced by determining a number of blocks residing along a net edge. By requiring data access to the VLEs along a given edge, data access is localized to specific rows or columns of VLEs. According to an embodiment of the present invention, data for all n blocks in a row or column of VLEs may be cached. The cached data may be used for n block moves. If a block is moved, incremental updates may be made to the cached data to avoid having the cached data go stale. When a bounding box edge changes between iterations, the cached data may be recomputed from scratch. Block net data may be pipelined through hardware, memory look up tables that index each net in a row or column may be used, or a parallel hash based on a binary sorted approach could be used.

Embodiments of the present invention provide an improved technique for performing bounding box costs by also defining mutually exclusive moves. The moves made in parallel by MPUs are limited to mutually exclusive moves to eliminate stale data used for cost computation. According to an embodiment of the present invention, two individual moves are mutually exclusive if the rows and columns covered by the moves do not intersect. By limiting a swapping distance between VLEs, the number of potential move candidates that can occur in parallel is increased. According to an embodiment of the present invention, in order to consider the largest number of mutually exclusive moves, only adjacent horizontal and vertical moves are considered. Given an n×n matrix of blocks there is a maximum of n/2 known pairs of blocks that can be swapped simultaneously.

According to an embodiment of the present invention, the hardware placement unit will perform placement on non-timing critical blocks. The software placement procedures in a CAD tool processes timing critical blocks. Together the hardware placement unit and the software placement procedures may work together to produce a placement solution that includes a maximum frequency which the system can operate that is optimal.

Figure 10:
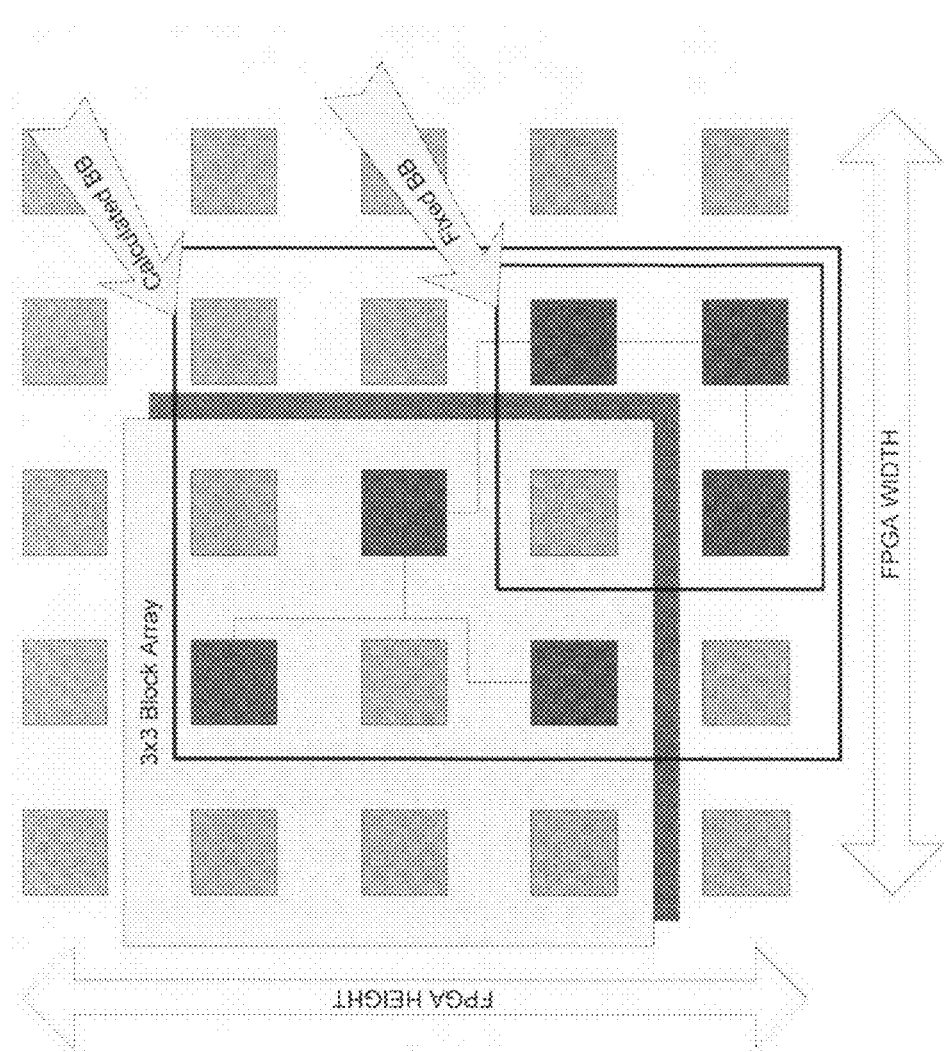
FIG. 10 illustrates a processing window for scaling a system design according to an exemplary embodiment of the present invention.

FIG. 10 illustrates a processing window 1010 for scaling a system design according to an exemplary embodiment of the present invention. When designing a large system design, it may be necessary to subdivide the system design in order to allow the memory and area limitations of the hardware placement unit to operate efficiently. A processing window 1010 is introduced to perform moves on a subset of blocks in the system design. Each net edge will have an associated fixed bounding box value. The value may be determined by the blocks belonging to the net outside the processing window 1010. To reduce bandwidth requirements, the processing window 1010 will incrementally scan across the actual system design.

Figure 11:
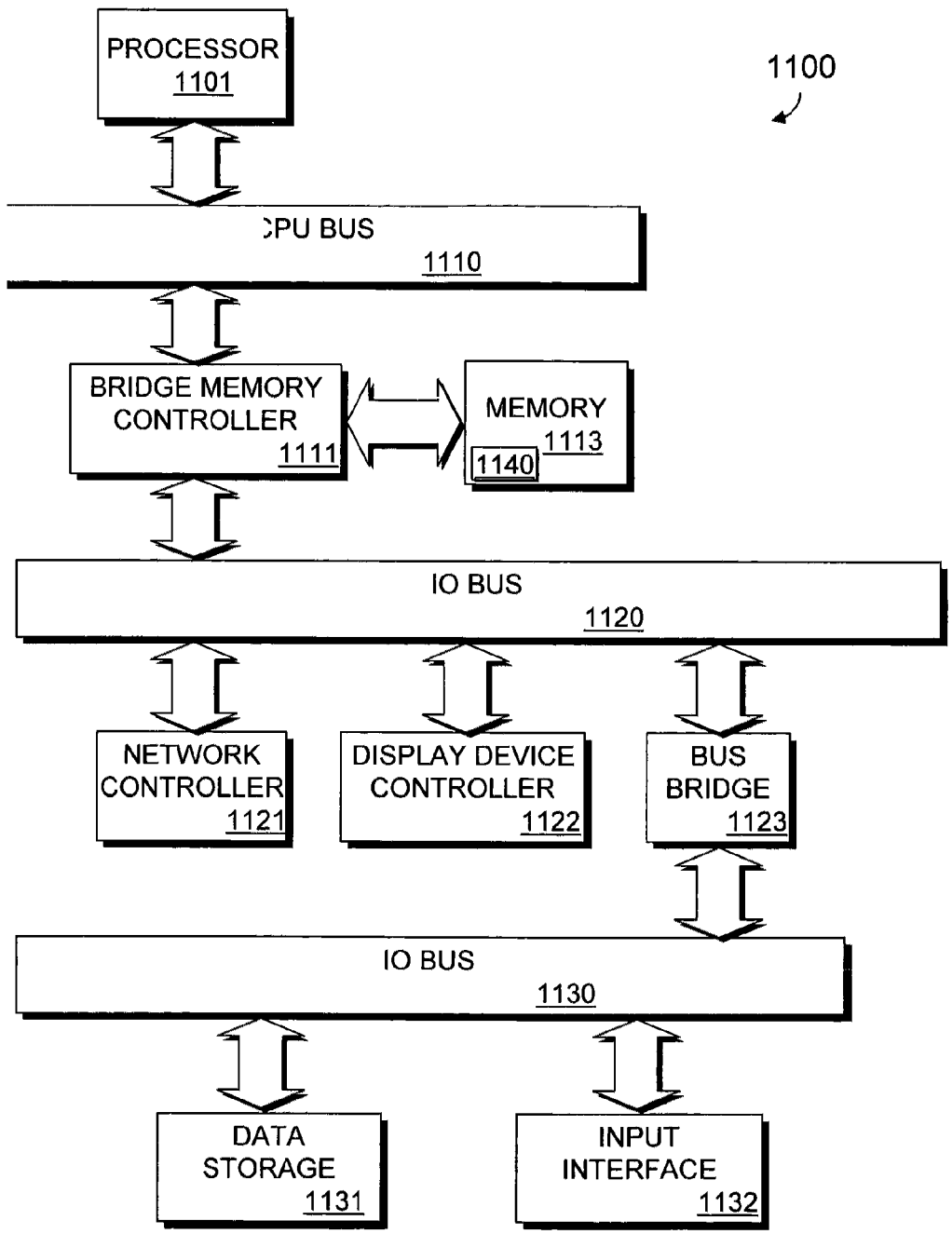
FIG. 11 is a block diagram that illustrates a computer system in which an exemplary embodiment of the invention resides.

FIG. 11 is a block diagram of an exemplary computer system 1100 in which an example embodiment of the present invention resides. As shown, the computer system 1100 includes a processor 1101. The processor 1101 is coupled to a CPU bus 1110 that transmits data signals between the processor 1101 and other components in the computer system 1100.

The computer system 1100 includes a memory 1113. The memory 1113 may be a dynamic random access memory device, a static random access memory device, and/or other memory device. The memory 1113 may store instructions and code represented by data signals that may be executed by the processor 1101. A bridge memory controller 1111 is coupled to the CPU bus 1110 and the memory 1113. The bridge memory controller 1111 directs data signals between the processor 1101, the memory 1113, and other components in the computer system 1100 and bridges the data signals between the CPU bus 1110, the memory 1113, and a first IO bus 1120.

The first IO bus 1120 may be a single bus or a combination of multiple buses. The first IO bus 1120 provides communication links between components in the computer system 1100. A network controller 1121 is coupled to the first IO bus 1120. The network controller 1121 may link the computer system 1100 to a network of computers (not shown) and supports communication among the machines. A display device controller 1122 is coupled to the first IO bus 1120. The display device controller 1122 allows coupling of a display device (not shown) to the computer system 1100 and acts as an interface between the display device and the computer system 1100.

A second IO bus 1130 may be a single bus or a combination of multiple buses. The second IO bus 1130 provides communication links between components in the computer system 1100. A data storage device 1131 is coupled to the second IO bus 1130. The data storage device 1131 may be a hard disk drive, a floppy disk drive, a CD-ROM device, a flash memory device or other mass storage device. An input interface 1132 is coupled to the second IO bus 1130. The input interface 1132 allows coupling of an input device to the computer system 1100 and transmits data signals from an input device to the computer system 100. A bus bridge 1123 couples the first IO bus 1120 to the second IO bus 1130. The bus bridge 1123 operates to buffer and bridge data signals between the first IO bus 1120 and the second IO bus 1130. It should be appreciated that computer systems having a different architecture may also be used to implement the computer system 1100.

A system designer 1140 may reside in memory 1113 and be executed by the processor 1101. The system designer 1140 may operate to synthesize the system, place the system on a target device, route the system, assemble the system, and program a target device to implement the system.

Figure 12:
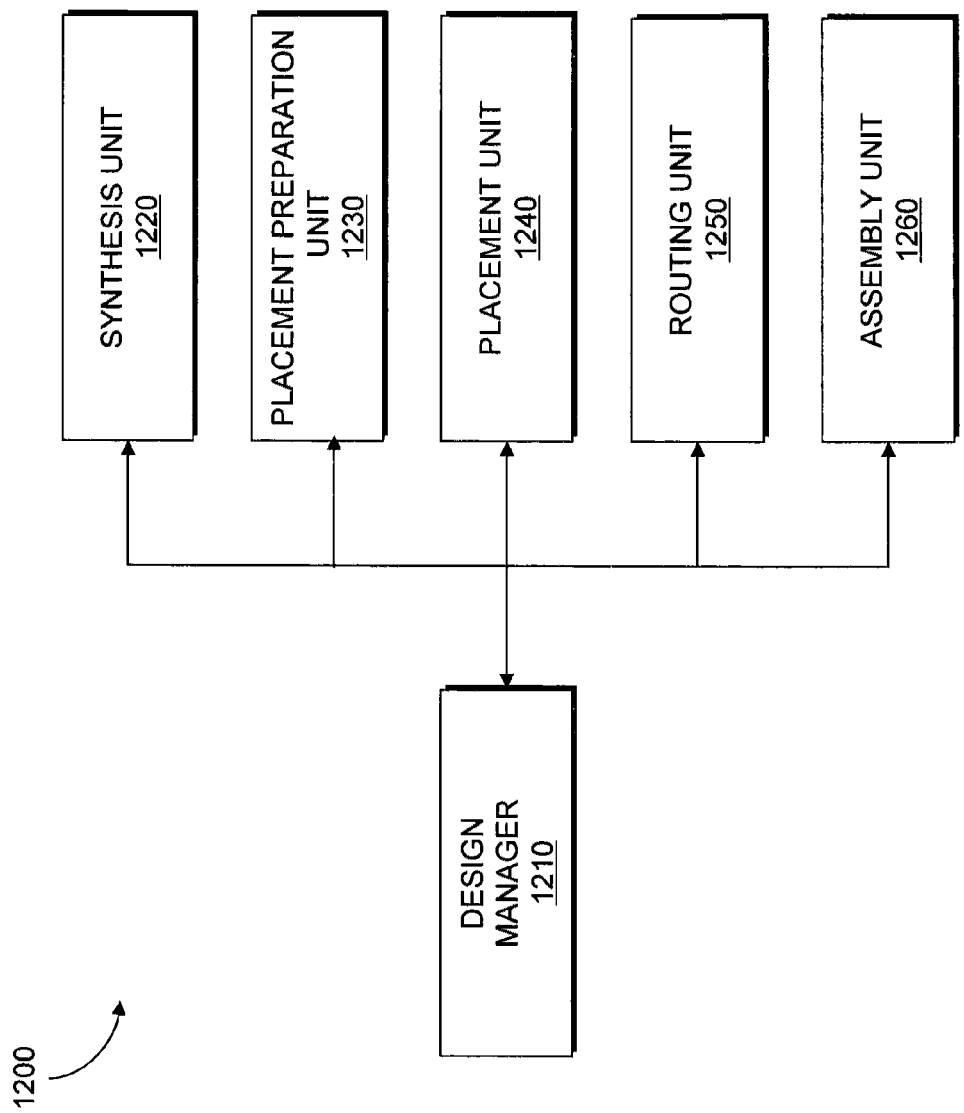
FIG. 12 is a block diagram of a system designer according to an exemplary embodiment of the present invention.

FIG. 12 illustrates a system designer 1200 according to an exemplary embodiment of the present invention. The system designer 1200 may be used to implement the system designer 1140 shown in FIG. 11 and may perform a subset of the procedures described in FIGS. 1 and 2. The system designer 1200 may be a CAD tool for designing a system on a target device. The target device may be, for example, an ASIC, a structured ASIC, an FPGA, a programmable logic device (PLD), a printed circuit board (PCB), or other circuitry. FIG. 12 illustrates modules implementing an embodiment of the system designer 1200. According to one embodiment, system design may be performed by a computer system (not shown) executing sequences of instructions represented by the modules shown in FIG. 12. Execution of the sequences of instructions causes the computer system to support system design as will be described hereafter. In alternate embodiments, hardwire circuitry may be used in place of or in combination with software instructions to implement the present invention. Thus, the present invention is not limited to any specific combination of hardware circuitry and software. The system designer 1200 includes a system designer manager 1210. The system designer manager 1210 is connected to and transmits data between the components of the system designer 1200. The system design manager 1210 may also perform elaboration on design information that is inputted into the system designer 1200. Elaboration may include reviewing the design information to ensure that the syntax of the information is correct.

Block 1220 represents a synthesis unit. The synthesis unit 1220 generates a logic design of a system to be implemented in the target device. According to an embodiment of the system designer 1200, the synthesis unit 1220 takes a conceptual Hardware Description Language (HDL) design definition and generates an optimized logical representation of the system. The optimized logical representation of the system generated by the synthesis unit 1220 may include a representation that has a minimized number of functional blocks and registers, such as logic gates and logic elements, required for the system. Alternatively, the optimized logical representation of the system generated by the synthesis unit 1220 may include a representation that has a reduced depth of logic and that generates a lower signal propagation delay. The synthesis unit 1220 also determines how to implement the functional blocks and registers in the optimized logic representation utilizing specific resources on a target device thus creating an optimized "technology-mapped" netlist. The technology-mapped netlist illustrates how the resources (components) on the target device are utilized to implement the system. In an embodiment where the target device is a FPGA, the components could be logical elements or adaptive logic modules. In an embodiment where the target device is an ASIC, the components could be gates or standard cells. In an embodiment where the target device is a structured ASIC, the technology-mapped netlist may contain components that can be implemented in the structured ASIC fabric, such as RAM blocks, multiplier blocks, and gates from a library of gates.

Block 1230 represents a placement preparation unit. The placement preparation unit 1230 identifies components in the optimized technology-mapped netlist to place and determines which components to assign to a CAD placement procedure for placement and which components to assign to a hardware placement unit for placement. According to an embodiment of the present invention, the placement preparation unit 1230 maps the resources on the target device to VLEs on the hardware placement unit, partitions the VLEs into partitions, assigns an MPU to each of the VLE partitions, and sets up iterations where the MPUs place blocks (components in the system design) the VLEs. The placement preparation unit 1230 may also identify mutually exclusive moves which the MPUs may perform in parallel.

Block 1240 represents a placement unit implemented by CAD placement procedures. The placement unit 1240 places the system on to the target device by determining which components or areas on the target device are to be used for specific functional blocks and registers. According to an embodiment of the system designer 1200, the placement unit 1240 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 1240 may utilize a cost function in order to determine a good assignment of resources on the target device.

Block 1250 represents a routing unit. The routing unit 1250 determines the routing resources on the target device to use to provide interconnection between the components implementing functional blocks and registers of the logic design.

Block 1260 represents an assembly unit. The assembly unit 1260 creates a data file that includes information determined by the compilation procedure performed by the system designer 800. The data file may be a bit stream that may be used to program a target device. According to an embodiment of the present invention, the data file generated may be transmitted to another computer system to allow the design of the system to be further processed. Alternatively, the data file may be transmitted to another computer system which may be used to program the target device according to the system design. By programming the target device with the data file, components on the target device are physically transformed to implement the system. It should be appreciated that the design of the system may also be output in other forms such as on a display device or other medium.

FIG. 13 illustrates a placement preparation unit 1300 according to an exemplary embodiment of the present invention. The placement preparation unit 1300 may be used to implement the placement preparation unit 1230 illustrated in FIG. 12 and perform the procedure illustrated in FIG. 2. Alternatively, portions of the placement preparation unit 1300 may be implemented by the hardware placement unit. The placement preparation unit 1300 includes a placement preparation manager unit (PPMU) 1310. The placement preparation manager unit 1310 is connected to and transmits information between components in the placement preparation manager unit 1310.

Block 1320 represents a timing unit. The timing unit 1320 determines whether a component to be placed has a timing requirement that is above or below a threshold value. This may determine whether the component is a critical component with respect to timing, associated with a critical signal, or is on a critical path. If it is determined that the component has a timing requirement that is above or below a threshold value, the component is identified as a component to be placed using a CAD tool implemented in software by a computer system.

Block 1330 represents a component type identifier unit. The component type identifier unit 1330 determines whether a component is of a type belonging to a set of components. According to an embodiment of the present invention, the set of components may include one or more of an input output (IO), memory, and digital signal processor (DSP), or other type of component. If the component is of a type that belongs to the set of components, the component is identified as a component to be placed using a physical placement unit.

Block 1340 represents a partition unit. The partition unit 1340 maps resources available to be assigned to components to VLEs on the hardware placement unit. The partition unit 1340 partitions the VLEs into sections and assigns a MPU to each of the sections. During an iteration of placement, the MPUs compute the cost of moving components between VLEs in each section.

Block 1350 represents a mutually exclusive move identifier (MEMI) unit. The MEMI unit 1350 identifies mutually exclusive moves that are considered for placement. According to an embodiment of the present invention, two individual moves are mutually exclusive if the rows/columns covered by the moves do not intersect.

The placement preparation manager unit 1310 off loads the placement of components assigned to be placed by the physical placement unit to the physical placement unit. Off loading the placement of components may involve having the physical placement unit compute the cost associated with moving a component or group of component that forms a block from one VLE location to a second VLE location. It should be appreciated that the placement preparation unit 1300 may support several iterations of moves, the summation of costs, and the evaluation of whether a cost is acceptable. Alternatively, the physical placement unit may be configured to perform some of these functionalities on chip. After placement results are generated by the physical placement unit, the placement preparation manager unit 1310 utilizes the placement results from the physical placement unit and CAD tool to generate a placement solution for the system design.

Embodiments of the present invention may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, comprising:
    assigning a first plurality of components in the system to be placed by a computer aided design (CAD) tool based on a criterion;
    assigning a second plurality of components in the system to be placed by a hardware placement unit, implemented in hardware, based on the criterion; and
    utilizing placement results from the CAD tool and the hardware placement unit to generate a placement solution for the system on the target device.

2. The method of claim 1, further comprising:
    synthesizing the system;
    routing the system;
    assembling the system; and
    programming the target device to physically transform resources on the target device to implement the system.

3. The method of claim 1, wherein the criterion comprises placing a component with a CAD tool when the component has a timing requirement that exceeds a threshold value.

4. The method of claim 1, wherein the criterion comprises placing a component with a CAD tool when the component is coupled to a critical path.

5. The method of claim 1, wherein the criterion comprises placing a component with a CAD tool when the component is an input/output (I/O).

6. The method of claim 1, wherein the criterion comprises placing a component with a CAD tool when the component is a memory.

7. The method of claim 1, wherein the criterion comprises placing a component with a CAD tool when the component is a digital signal processors (DSP).

8. The method of claim 1, wherein assigning a second plurality of components in the system to be placed by a hardware placement unit based on the criterion comprises:
    mapping resources on the target device to virtual logic elements (VLEs) arranged in rows and columns on the hardware placement unit;
    partitioning the VLEs into sections;
    assigning a move processing unit (MPU) to each of the sections of (VLEs); and
    directing MPUs to compute costs of moving components between VLEs.

9. The method of claim 8, wherein the directing is performed if a move between one set of VLEs does not intersect rows and columns of a second set of VLEs.

10. The method of claim 8, wherein the MPUs compute costs of moving components between VLEs in parallel.

11. A method for computing cost using a field programmable gate array (FPGA), comprising:
    mapping resources on a target device to virtual logic elements (VLEs) arranged in rows and columns;
    partitioning groups of VLEs into a plurality of sections;
    assigning a unique move processing unit (MPU) on the FPGA to each section of the plurality of sections; and
    each unique MPU computing costs of moving components between VLEs in its associated section, wherein at least one of the mapping, partitioning, assigning, and having is performed using a FPGA.

12. The method of claim 11, wherein each of the unique MPUs computes the costs of moving components between VLEs in its associated section by:
    identifying net boundary edges for a net associated with the components at a first VLE and a second VLE;
    identifying a number of VLEs used to implement components coupled to the net at the net boundary edges; and
    assigning costs to moving components between the first and second VLEs based on whether the net boundary increases or decreases and further based on a number of VLEs used to implement components coupled to the net at a net boundary edge that has moved.

13. The method of claim 12, wherein assigning the costs to moving components comprises assigning a cost of 1 if the net boundary increases with moving the components from the first VLE to the second VLE.

14. The method of claim 12, wherein assigning the cost to moving components comprises assigning a cost of −1 if the net boundary decreases with moving the components and if 1 VLE is at the net boundary edge that is moved.

15. The method of claim 12, wherein assigning the cost to moving comprises assigning a cost of 0 if the net boundary decreases with moving the component and if more than 1 VLE is at the net boundary edge that is moved.

16. The method of claim 12, wherein identifying the net boundary edges comprises retrieving net boundary edge information stored in memory of the FPGA.

17. The method of claim 12, wherein identifying a number of VLEs at the net boundary edges comprises retrieving net identifier information stored in memory of the FPGA.

18. The method of claim 12, further comprising:
    moving the components between the first and second VLEs in response to the costs computed; and
    updating net boundary edge information and net identifier information associated with a net upon moving the components.

19. The method of claim 11, further comprising another MPU computing costs of moving other components between VLEs in another group in parallel with the MPU.

20. A hardware placement unit, comprising:
    a first plurality of memory blocks operable to store virtual logic elements (VLEs) that represent resources on a target device, components in a system design implemented by the resources represented by the VLEs, and nets associated with the components;
    a second plurality of memory blocks operable to store net boundary elements (NBEs) that identify net boundary edges of nets associated with the components; and
    a move processing unit (MPU) operable to compute a cost of moving the components between a first and second VLE based on whether the net boundary increases or decreases and a number of VLEs used to implement the components coupled to the net at a net boundary edge that has moved.

21. The hardware placement unit of claim 20, further comprising another MPU operable to compute a cost of moving the components between a third and fourth VLE in parallel with the MPU computing the cost of moving components between the first and second VLE.

22. The hardware placement unit of claim 20, wherein the MPU moves the components between the first and second VLE in response to determining that the cost is acceptable and updates the VLEs and NBEs to reflect the move.

23. The hardware placement unit of claim 20, wherein the hardware placement unit is implemented on a field programmable gate array (FPGA).

24. A system designer, comprising:
    a synthesis unit operable to synthesize a system; and
    a placement preparation unit operable to assign a first plurality of components in the system to be placed by an computer aided design (CAD) tool and a second plurality of components in the system to be placed by a hardware placement unit, implemented in hardware, based on a criterion, and utilizing placement results from the CAD tool and the hardware placement unit to generate a placement solution for the system on the target device.

25. The system designer of claim 24, wherein the placement preparation unit comprises a timing unit operable to determine whether a component to be placed has a timing requirement that is above or below a threshold value.

26. The system designer of claim 24, wherein the placement preparation unit comprises a component type identifier unit operable to determine whether a component to be placed is one of a 1) input/output, 2) memory, and 3) digital signal processor.

* * * * *